United States Patent [19]
Braden

[11] 3,941,242
[45] Mar. 2, 1976

[54] AXIAL LEAD COMPONENT FEEDER WITH ANTI-BUNCHING MECHANISM

[75] Inventor: Denver Braden, San Diego, Calif.

[73] Assignee: Illinois Tool Works Inc., Chicago, Ill.

[22] Filed: Dec. 12, 1974

[21] Appl. No.: 531,935

[52] U.S. Cl. .................... 198/254; 193/2 B; 198/41; 198/220 DA
[51] Int. Cl.² .......................................... B65G 47/24
[58] Field of Search ............ 198/252, 253, 254, 41, 198/53, 220 DA; 193/2 B; 209/81, 81 A, 73

[56] References Cited
UNITED STATES PATENTS

| | | | |
|---|---|---|---|
| 1,432,738 | 10/1922 | Alwart................................. | 193/2 B |
| 3,537,580 | 11/1970 | Beroset............................ | 198/254 X |

*Primary Examiner*—Evon C. Blunk
*Assistant Examiner*—Douglas D. Watts
*Attorney, Agent, or Firm*—Glenn W. Bowen; Robert W. Beart

[57] ABSTRACT

A device for feeding axial lead electrical components is disclosed. The device consists of a magnetic feed bin which is constructed to produce a magnetic field that suspends the components in the bin and moves them towards a pick-up wheel. The pick-up wheel is constructed of nonmagnetic material and has magnets embedded therein which hold the components in slots in the periphery of the wheel. A cylindrical shaft having a flat surface on it is positioned under the input end of a shelf which supports the feed bin. A cam, which is driven in synchronism with the feed wheel, cooperates with a cam follower that is mounted on a lever arm. The lever arm is secured to the shaft that has the flat on it so that the input end of the magnetic feed bin is periodically rocked up and down to prevent bunching of the components in the feed bin in order to insure proper sequential feeding of the components from the bin to the magnetic pick-up wheel.

4 Claims, 6 Drawing Figures

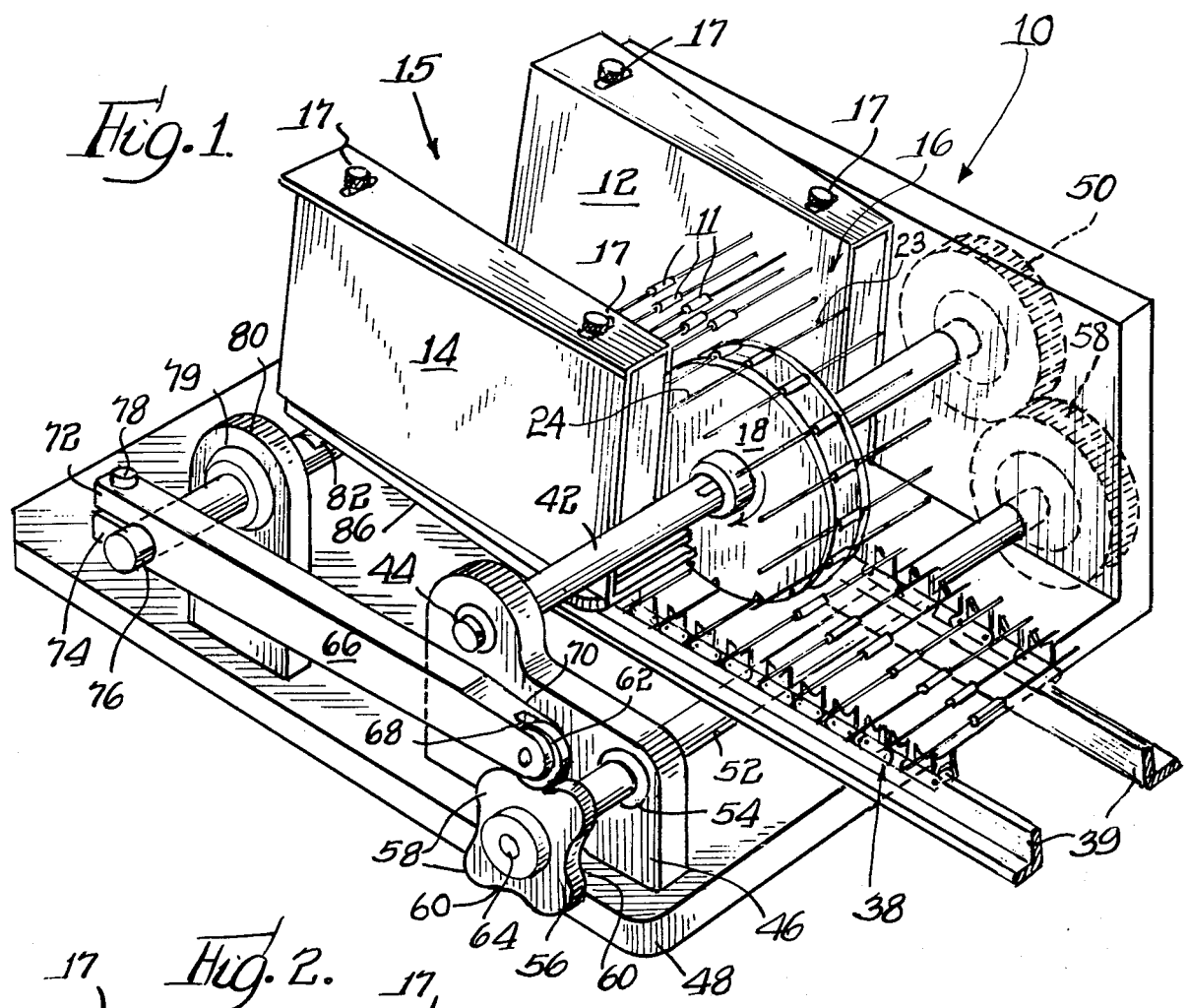
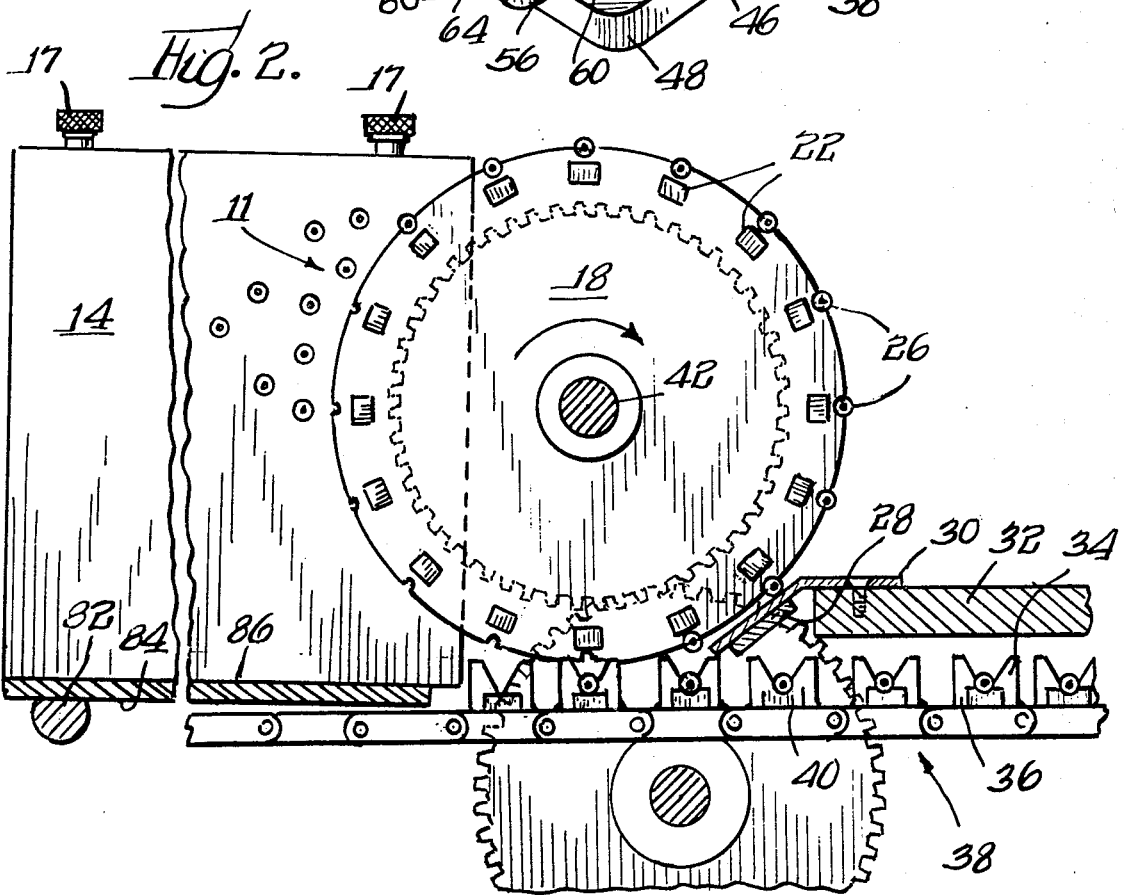

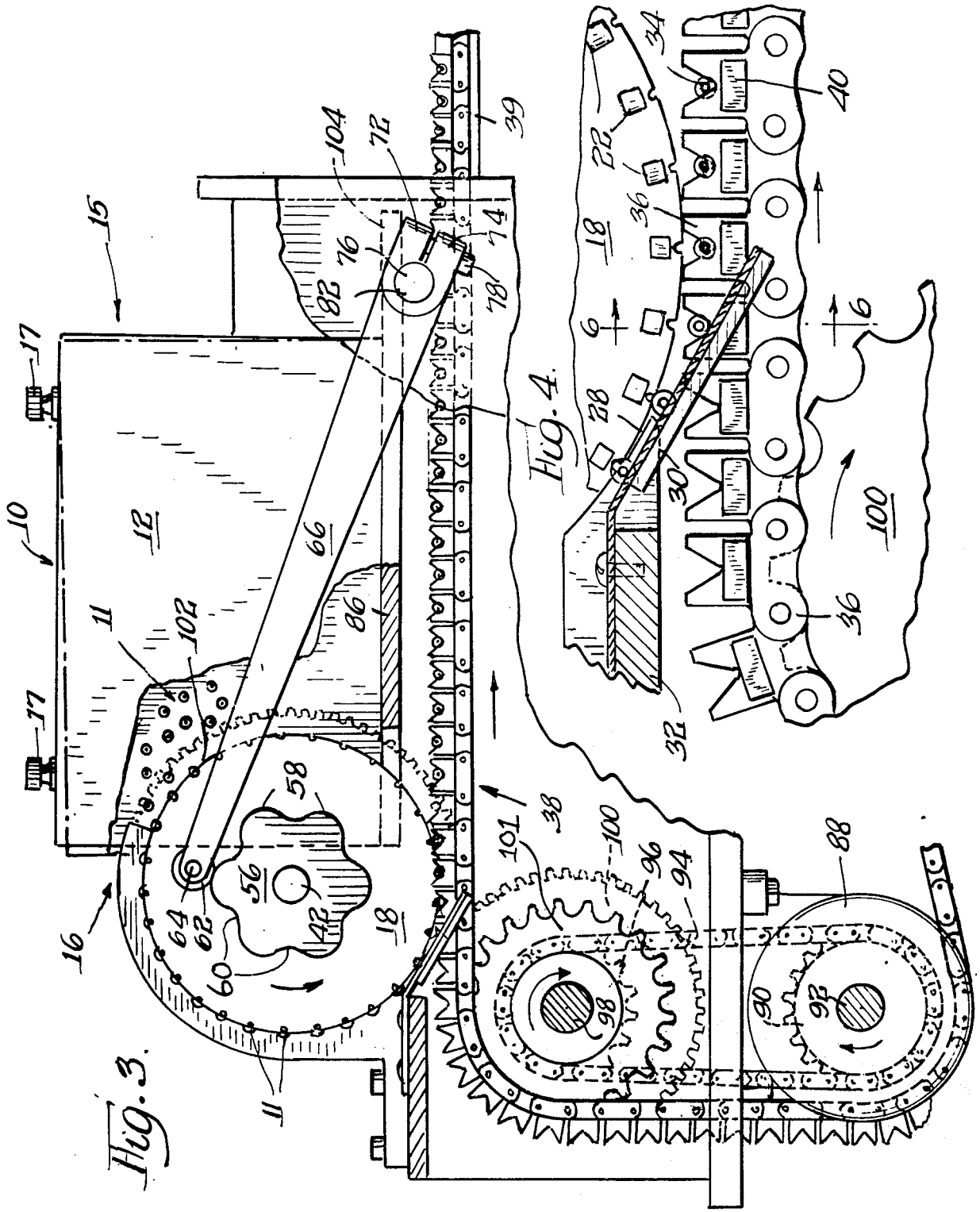

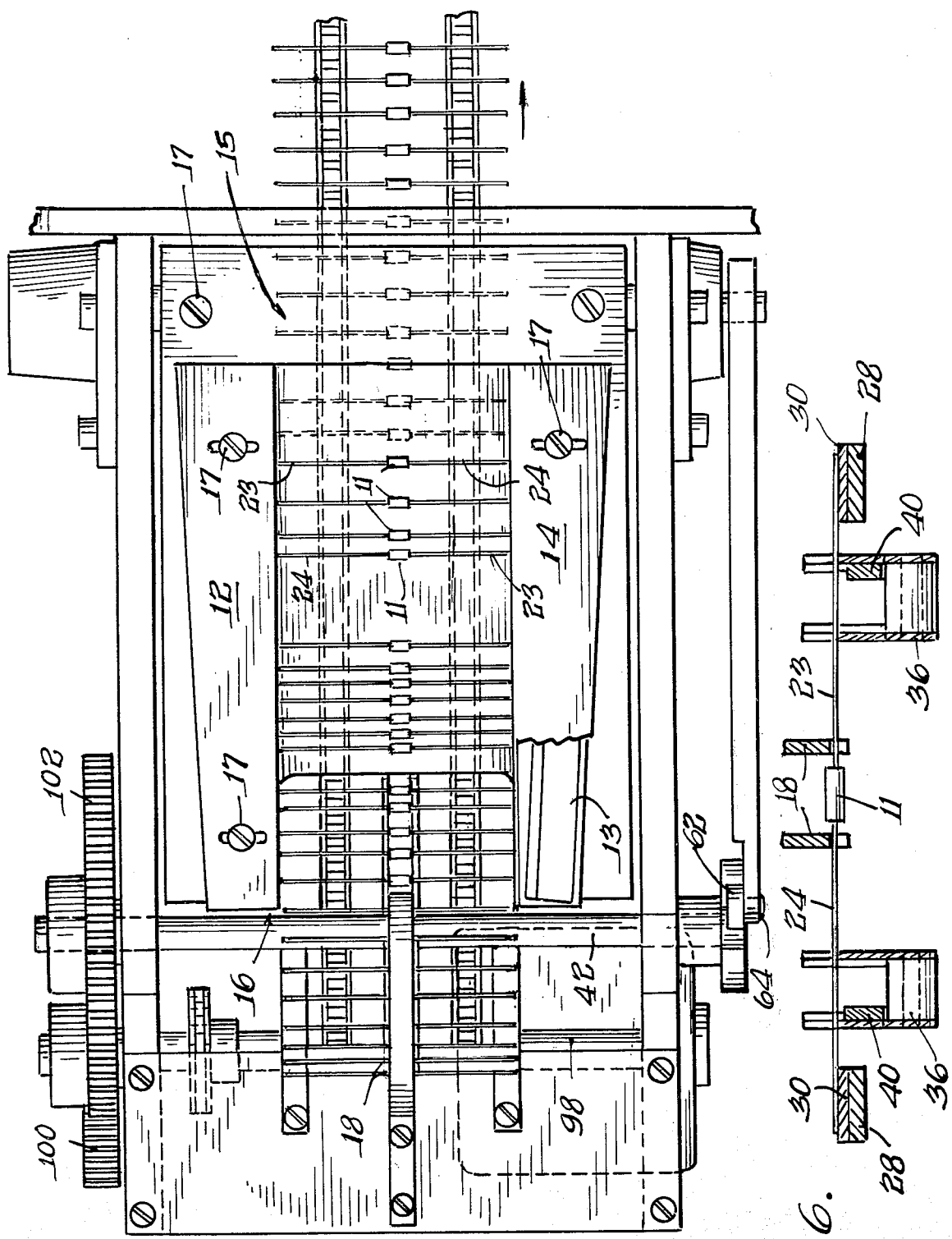

AXIAL LEAD COMPONENT FEEDER WITH ANTI-BUNCHING MECHANISM

BACKGROUND OF THE INVENTION

The present invention is directed to an electrical component, axial lead feeding system which utilizes a magnetic feeding apparatus of the type disclosed in the Beroset et al U.S. Pat. Nos. 3,388,375 and 3,537,580. The feeding apparatus of the Beroset et al patents consists of a magnetic bin which suspends axial lead electrical components in a magnetic field. The feed bin is constructed with magnetic members in the side walls which are positioned and shaped so that the magnetic flux density in the bin increases as the output end of the bin is approached, so as to move the components toward the output end of the bin. A rotating pick-up wheel is positioned at the output end of the feed bin which sequentially receives the leads of the components in pairs of notches formed in the periphery of the pick-up wheel. The pick-up wheel is constructed of nonmagnetic material and has a magnet embedded in it in the vicinity of each of the notches so as to guide the component into position in the notches as the pick-up wheel rotates. A pull-down magnet, which is positioned below the pick-up wheel, serves to pull the components from the pick-up wheel and to deposit them on notches in a conveyor chain which also has magnets secured to it that hold the components in place on the chain.

In order for the components to be fed sequentially to the pick-up wheel, so that each pair of notches in the feed wheel is supplied with a component without interruption, it is necessary to prevent bunching of the components in the feed bin. Bunching will occasionally occur in the feed bin of the Beroset et al patents due to the interaction of the magnetic field from the side walls of the bin and the effect of this field on the axial lead of the components. This can cause an occasional feeding failure of components from the feed bin to the pick-up wheel. It has been discovered that periodically rocking the input end of the feed bin up and down will eliminate automatically malfunction of the feed system due to the bunching of components in the feed bin so that continuous feeding of components from the input end to the output end of the bin and on to the pick-up wheel can be accomplished.

DESCRIPTION OF THE DRAWINGS

The present invention is illustrated by reference to the drawings in which:

FIG. 1 is a perspective view of one version of an axial lead feeder and anti-bunching mechanism in accordance with the present invention;

FIG. 2 is an end view of the feed bin and the anti-bunching mechanism of FIG. 1;

FIG. 3 is a side view of a second version of an axial lead feeder and anti-bunching mechanism in accordance with the present invention;

FIG. 4 is an enlarged view showing the pull-down magnets and the conveyor chain of FIG. 3;

FIG. 5 is a plan view of the axial lead feeder and anti-bunching mechanism of FIG. 3; and FIG. 6 is an enlarged partial sectional view of the pull-down magnets and conveyor chain taken along the lines 6—6 of FIG. 4.

TECHNICAL DESCRIPTION OF THE INVENTION

In FIG. 1 of the drawings, a magnetic feeding bin 10 of the type disclosed in the Beroset et al U.S. Pat. Nos. 3,388,795 and 3,537,580 is shown. The bin has a pair of side walls 12,14 which may be formed from standard low-carbon steel. The side walls enclose elongated magnets 13 (see FIG. 5) which are positioned so they converge from the input end 15 towards the output end 16 of the bin 10. The side walls 12,14 are held together by means of the locking bolts 17. The position and shape of the magnets is designed so that an increasing magnetic flux field is produced towards the output end of the bin 10 so that is axial lead electrical components are placed in the bin, they will be suspended between the walls 12,14 and will tend to move forwards toward the output end 16 of the bin 10 under the influence of the magnetic field.

Positioned at the output end 16 of the bin 10 is a nonmagnetic pick-up wheel 18 which has a plurality of pairs of notches 26 in its outer periphery. Behind each of the notches 26, a magnet 22 is embedded in the interior of the wheel 18. The embedded magnets 22 have sufficient strength so that they will attract the leads 23,24 of an axial lead component 11 from the output end 16 of the bin 10. Each component 11 is, thus, sequentially fed to the pick-up wheel 18 from the bin 10 as the pick-up wheel 18 rotates. The components 11 on the pick-up wheel 18 are then brought near the pull-down magnets 29 which are secured to the braces 30 that are mounted on a frame member 32 below the pick-up wheel 18. As the components 11 come into the vicinity of the pull-down magnets 28 (shown in FIG. 2), they are pulled from the notches 26 in the wheel 18 and are dropped into the notches 34 in the chain links 36 which form the conveyor chain 38 that continually passes under the pick-up wheel 18. The chain 38 is guided by the chain guide 39 as it moves away from the pick-up wheel 18. The direction of motion of the various elements of the apparatus are shown by directional arrows in the figures. The chain links 36 each have a permanent magnet 40 secured to them which serves to hold the leads 23,24 in place in the chain links 36 of the moving chain 38. The electrical components 11, which are suspended in the feed bin 10, are, thus, sequentially deposited onto the pick-up wheel and are carried to the conveyor chain 38 where they may be conveyed to a remote location for continued processing or testing. A more detailed description of the feed bin 10 and the pick-up wheel 18 may be found in the Beroset et al U.S. Pat. Nos. 3,388,794 and 3,537,580; and the disclosures of these patents are hereby incorporated by reference into the present application.

While the described magnetic feed bin and pick-up wheel of the Beroset et al patents are ideally suited for feeding small electrical axial lead components, it has one serious drawback in that it occasionally becomes fully partially inoperative due to feeding failures wherein all of the pairs of notches on the pick-up wheel are not supplied with a component even though there is an adequate supply of components in the feed bin. This is caused by bunching of the components which occurs due to the combined effect of the magnetic field from the magnets in the side walls of the feed bin and to the magnetic interaction of the leads of the components themselves. It has been discovered that mechanically rocking the feed bin in a periodic manner, preferably at its input end, will prevent bunching of the components in the bin; thus, eliminating the previously mentioned feeding problems.

FIGS. 1 and 2 illustrate one version of the present invention for periodically rocking the input end 15 of the magnetic feed bin 10. In this embodiment, the pick-up wheel 18 is suspended on a shaft 42 which has one end supported by a bearing 44 in a bearing block 46 that is secured to a base 48 and its other end carries a drive gear 50. The bearing block 46 also supports a second shaft 52 in a second bearing 54. One end of the shaft 52 carries a cam 56 which has a plurality of lobes 58 on it which are separated by a plurality of valleys 60. The other end of the shaft 52 is secured to a second drive gear 59 which is in mesh with the drive gear 50. Either of the drive gears 50 or 59 may be driven by another driven gear secured to a motor shaft or other drive means (not shown).

The pick-up wheel 18 is driven in unison with the cam 56 through the gears 50,59 and the shafts 42,52. A cam follower wheel 62 rides on the outer periphery of the cam 56. The cam follower wheel 62 is supported by a shaft 64 in the lever arm 66 between the bifurcated outer ends 68,70. The rear end of the lever arm 66 has two other bifurcated ends 72,74 which allow the outer end of the shaft 76 to be locked in place between the ends 72,74 when the lock bolt 78 is tightened. The shaft 76 is supported by a bearing 79 which is in a second bearing block 80 that is secured to the base 48. The shaft 76 has a flat central surface portion 82 which rests against the flat under surface 84 of the support shelf 86 when the cam follower 62 is in a lobe 58 of the cam 56. As the cam 56 turns so that the cam follower 62 rides into a valley 60, the lever arms 66 rotates the shaft 76 thereby causing the input end 15 of the bin 10 to be elevated; and the output end 16 to be lowered. As the cam follower 62 then traverses the cam into the next lobe 58, the input end 15 of the feed bin 10 will be lowered back to its original position and the output end 16 will be raised to its initial position. In this manner, as the cam 56 continues to rotate at a relatively constant rate, a continual raising and lowering of the input and output ends 15,16 will occur, thereby resulting in periodic rocking of the magnetic feed bin 10, which will maintain the described distribution of components 11 in the feed bin 10.

FIGS. 3 through 4 show a second version of the present invention. Similar components are labelled in the same manner in FIGS. 3 through 6 as they were in the description of FIGS. 1 and 2, since the general overall construction of the embodiment of the pick-up wheel 18 and the magnetic feed bin 10 is the same in both versions.

Referring to FIG. 3, a drive motor 88 has a chain drive sprocket 90 secured to its output shaft 92 to drive a drive chain 94 that is coupled to a second chain drive sprocket 96. The sprocket 96 is secured to the gear shaft 98 of a conveyor drive gear 100 for the conveyor chain 38. The gear 100 is in mesh with a second gear 102 which is secured to the shaft 42 for the pick-up wheel 18. The conveyor drive gear 100 preferably has a slightly lower gear ratio than the drive gear 102. For example, the gear 100 may contain 72 teeth; while the gear 102 may contain 96 teeth. The sprocket 101 drives the conveyor chain 38.

The most significant difference between the version of the invention shown in FIGS. 3 through 6 and the version of the invention shown in FIGS. 1 and 2 is that the cam 56 is mounted on the same shaft that carries the pick-up wheel 18 in the version of FIGS. 3 through 6, instead of on a separate shaft as in the version of FIGS. 1 and 2. Mounting the cam 56 on the shaft 42 eliminates the need for a separate shaft and bearing support; however, it may be necessary in this version to provide an extension portion 104 of the support shelf 86 in order to obtain enough rotation of the shaft 76 to lift the input end 15 by a sufficient amount. The corresponding elements, which have the same numbers in both of the described versions, function in an identical manner in both versions; and, therefore, these elements are not described again in conjunction with the description of the later embodiment.

The invention is claimed as follows:

1. An axial lead feeding apparatus having an input end and an output end for feeding axial lead components to a conveying means comprising a magnetic feed bin having magnetic elements which supply a magnetic field that suspends said electrical components in said bin, a pick-up wheel for transferring said components from said feed bin to said conveying means having a plurality of pairs of notches on its periphery and a magnet associated with each of said notches for attracting the leads of said electrical components so that the leads of one of said components can be drawn into each pair of said notches, drive means for rotating said wheel adjacent the output end of said magnetic feed bin and rocking means synchronized with the rotation of said magnetic feed wheel for periodically rocking said magnetic feed bin in order to prevent bunching of said components and to maintain a satisfactory feeding distribution of said components in said feed bin, including means which contacts the input end of said feed bin and is constructed to periodically rock said input end of said feed bin up and down.

2. An axial lead feeding apparatus as claimed in claim 1 wherein said rocking means comprises a cam having a plurality of lobes and valleys, a cam follower, a lever arm having first and second ends which support said cam follower at said first end, a shaft secured to said second end of said lever arm having a flat portion thereon which contacts said magnetic feed bin adjacent said input end so as to rock said input end up and down in a periodic manner as said cam follower sequentially travels from lobe to valley and from valley to lobe.

3. An axial lead feeding apparatus as claimed in claim 2 wherein said cam is supported on a first shaft and said pick-up means is supported on a second shaft which is driven in synchronism with said first shaft.

4. An axial lead feeding apparatus as claimed in claim 2 wherein said pick-up means and said cam are supported on the same driven shaft.

* * * * *